(12) United States Patent
Fuji

(10) Patent No.: US 7,800,940 B2
(45) Date of Patent: Sep. 21, 2010

(54) SEMICONDUCTOR MEMORY DEVICE AND WRITING METHOD THEREOF

(75) Inventor: Yukio Fuji, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 161 days.

(21) Appl. No.: 12/213,051

(22) Filed: Jun. 13, 2008

(65) Prior Publication Data

US 2008/0253169 A1 Oct. 16, 2008

Related U.S. Application Data

(63) Continuation of application No. 11/340,623, filed on Jan. 27, 2006, now Pat. No. 7,391,643.

(30) Foreign Application Priority Data

Feb. 8, 2005 (JP) ............................. 2005-031922

(51) Int. Cl.
*G11C 11/00* (2006.01)
(52) U.S. Cl. .............. 365/163; 365/189.02; 365/189.07
(58) Field of Classification Search ................. 365/163, 365/189.02, 189.07
See application file for complete search history.

(56) References Cited

U.S. PATENT DOCUMENTS

| | | | |
|---|---|---|---|
| 5,748,558 A | 5/1998 | Suzuki | |
| 5,757,704 A | 5/1998 | Hachiya | |
| 6,337,809 B1 * | 1/2002 | Kim et al. | 365/189.05 |
| 6,614,698 B2 * | 9/2003 | Ryan et al. | 365/189.04 |
| 7,038,961 B2 | 5/2006 | Sakata et al. | |
| 7,391,643 B2 * | 6/2008 | Fuji | 365/163 |
| 7,609,545 B2 * | 10/2009 | Osada et al. | 365/163 |
| 2002/0174310 A1 | 11/2002 | Ueyama | |
| 2004/0085850 A1 | 5/2004 | Kato et al. | |

FOREIGN PATENT DOCUMENTS

| | | |
|---|---|---|
| JP | 8-045277 | 2/1996 |
| JP | 2888201 | 2/1999 |

(Continued)

OTHER PUBLICATIONS

Woo Yeong Cho et al., "A 0.18μm 3.0V 64Mb Non-Volatile Phase-Transition Random-Access Memory (PRAM)," 2004 IEEE International Solid-State Circuits Conference, Session 2, Feb. 2004.

*Primary Examiner*—Pho M Luu
(74) *Attorney, Agent, or Firm*—Foley & Lardner LLP

(57) ABSTRACT

A semiconductor memory device includes a phase-change memory and has high compatibility with DRAM interface. The memory cell array includes a memory cell that includes a phase-change element provided at the intersection of a bit line and word line. A write address and data accompanying a write request are temporarily held in a write address register and a data register respectively, and a write operation is not performed on the memory cell array in this cycle of write request. And when a next write request occurs, the held data is written to the memory cell array. At this time, two write cycles—RESET cycle and SET cycle—are provided. Then the written contents of the memory cell and the rewrite data are compared, and after only SET cells are temporarily RESET (amorphization, increasing the resistance), it is operated so as to write only SET data (crystallization, lowering the resistance).

10 Claims, 8 Drawing Sheets

FOREIGN PATENT DOCUMENTS

| | | |
|---|---|---|
| JP | 2004-206850 A | 7/2004 |
| JP | 2004-289029 A | 10/2004 |
| JP | 2004-355689 A | 12/2004 |
| WO | WO 01/61503 | 8/2001 |
| WO | WO 2004/025659 A1 | 3/2004 |

* cited by examiner

SEMICONDUCTOR MEMORY DEVICE AND WRITING METHOD THEREOF

CROSS-REFERENCE TO RELATED PATENT APPLICATIONS

This application is a continuation of application Ser. No. 11/340,623, filed Jan. 27, 2006, now pending, and based on Japanese Patent Application No. 2005-031922, filed Feb. 8, 2005, by Yukio Fuji, the disclosures of which are incorporated herein by reference in their entirety. This application claims only subject matter disclosed in the parent application and therefore presents no new matter.

FIELD OF THE INVENTION

The present invention relates to a semiconductor memory device and writing method thereof and particularly a semiconductor memory device using a programmable memory with a resistance element and writing method thereof.

BACKGROUND OF THE INVENTION

In recent years, the market demand for large-capacity, low power consumption SDRAMs has increased as work memories for image processing and video processing in mobile telephones and mobile devices. Especially, in mobile devices, as it is integrated into SIP (System in Package) with a CPU more and more, the major reduction of the refresh current and consumption current is expected. In such a situation, a limit on the processing speed occurs from data transfer from a work memory to a flash memory and retransfer from the flash memory to the work memory, therefore the demand for non-volatile memory/non-volatile RAMs whose write speed and read speed are SDRAM interface compatible has increased. As candidates for such a non-volatile RAM, FeRAM/MRAM (Ferroelectric Random Access Memory/Magnetoresistive Random Access Memory) have been developed. In FeRAM, which utilizes ferroelectrics, high integration is difficult at this point, and so is realizing the capacity and speed of DRAMs. Furthermore, in MRAM, which utilizes non-volatile magnetoresistive, since a write magnetic field is generated, the necessary write current per bit is several mA order and the write current consumption is too big.

Meanwhile, as a programmable memory with a resistance element, phase-change element is a promising candidate as researches have been done in order to realize non-volatile RAM. Since the write speed of phase-change memories is slow, the specifications that show compatibility with low power SRAMs or flash memories are conventionally reported. Especially in the SRAM specifications, phase-change memories offer a big promise since low power consumption is realized and the write speed is faster compared with non-volatile memories or flash memories.

Phase-change memory is a non-volatile memory where the characteristic of chalcogenide materials (such as Ge, Sb, and Te) that go back and forth between an amorphous state (high resistance) and a crystalline state (low resistance) when heated is utilized. Generally it is changed between a high resistance state (RESET) and a low resistance state (SET) by the joule heat caused by electric current and the amount of time the heat is applied, and approximately several 10 s to 100 ns of write time is needed. For instance, the structure of a 64 Mb RAM using a phase-change memory that takes 120 ns to be driven into a low resistance state (SET time) and approximately 50 ns to be driven into a high resistance state (RESET time) is described in Non-Patent Document 1.

Phase-change elements are non-volatile memory elements, however, voltage and current are applied to a phase-change element by a read disturbance, and the resistance value of the phase-change element is changed, deteriorating the retention characteristics and read margin.

Similarly, it is known that, because of the voltage and current applied to a phase-change element by a similar disturbance when being written to, the resistance value change will deteriorate over time. FIG. 6 is a drawing showing the resistance value change of a phase-change element caused by read/write operations. The abscissa indicates how many times read/write operation has been performed, and the ordinate shows the resistance values of the phase-change element when it is SET/RESET. The more read/write actions are performed, the more the element resistance value decreases.

Meanwhile, a semiconductor memory device that delays the timing of a write operation to a memory cell upon receiving a write request in the write operation of a volatile synchronous SRAM is known (for instance refer to Patent-Documents 1 and 2). Such a method is called late write method, and write operations can be performed stably.

[Non-Patent Document 1]
Woo Yeong Cho, et al. "A 0.18 µm 3.0V 64 Mb Non-Volatile Phase-Transition Random-Access Memory (PRAM)," 2004 IEEE International Solid-State Circuits Conference, ISSCC 2004, SESSION 2, NON-VOLATILE MEMORY, 2.1, Feb. 16, 2004.
[Patent Document 1]
Japanese Patent Kokai Publication No. JP-A-8-45277
[Patent Document 2]
Japanese Patent No. 2888201

SUMMARY OF THE DISCLOSURE

When a memory device compatible with synchronous DRAM (SDRAM) interface is realized using a phase-change element, the following points should be considered, according to the view of the present invention.

1) Write operations can be repeated as many times as $10^{12}$. This number is approximately the same as flash memory, however, about four digits smaller than DRAM. As write/read operations are repeated, the element characteristics deteriorate and memory data may be destroyed (refer to FIG. 6).
2) If the same data is repeatedly written to the same cell, for instance, the low resistance state will have even lower resistance. This means that the high resistance state will not have high enough resistance even when the data is written so that it will be in a high resistance state (refer to FIG. 6). FIG. 7 is a drawing illustrating changes and distributions of the resistance value of a conventional phase-change element after being read/written, and an initial RESET resistance distribution (RReset), a RESET resistance distribution after being rewritten an n number of times (Rreset'), an initial SET resistance value (RSset), and a SET resistance distribution after being written an n number of times (RSet') are shown.

When data is overwritten, since a change of state occurs and the resistance value fluctuates because of the characteristics of the element, resistance dispersion among memory cells becomes big, influencing on the characteristics greatly (refer to FIGS. 6 and 7). If read/write operations are simply repeated, the retention characteristics will deteriorate because of the above-mentioned characteristics of the phase-change element and it will not function as a memory element anymore.

In order to avoid such a situation, because of the restriction caused by the characteristics of the phase-change element, it is necessary to employ a method in which desired data is written after the memory element is set to a stable state (SET or RESET) instead of rewriting data.

In order to realize a memory device compatible with SDRAM interface, the total write time is, taking data comparison into consideration, the sum of the read time, time for comparing with written data, RESET time, and SET time. This series of operations for change or even hurt the specifications of the SDRAM. Therefore, it is difficult to realize a memory device compatible with SDRAM interface (refer to FIG. 8). Further, since it is necessary to control a write operation individually for each address when the write operation is performed according to each address input and data input as shown in FIG. 8, the circuit scale will increase. When batch control is performed in order to avoid the individual control, it is difficult to perform the write operation intended in the above-mentioned 2) between tWR+tRP since the write operation starts when the last address input is complete.

Accordingly, there is much to be desired in the art according to the analyses made by the present invention.

In order to solve the above-mentioned problems, a method in which the late write method is applied to write to a phase-change memory has been invented to overcome the limitations of the element characteristics of the phase-change element.

A write method of a semiconductor memory device relating to an aspect of the present invention is a write method for a memory cell comprising a programmable resistance element provided at the intersection of a bit line and a word line. In this method, a write address and write data accompanying a write request are temporarily stored in a write address register and a data register, respectively, and the write address and the write data are respectively held until a next write request.

In a write method of a first developed form, the address held in the address register and an address supplied by a new write request may be compared, and a write control for the memory cell may be performed based on the result of the comparison.

In a write method of a second developed form, a memory cell corresponding to the address supplied is read and data written in the memory cell and the value of the data register may be compared in the write control.

In a write method of a third developed form, a write operation may comprise a first write cycle where the resistance element is changed from a first state to a second state, and a second write cycle where the resistance element is changed from the second state to the first state.

In a write method of a fourth developed form, the write control may be performed so as to write only rewrite data corresponding to the first state after storing a write address and rewrite data in the write address register and the data register, respectively, comparing the written content of a memory cell and the rewrite data, and temporarily turning only memory cells in the first state to the second state.

In a write method of a fifth developed form, the first write cycle may be executed upon a first write request, a second write request following the first write request may be detected, and the second write cycle may be executed.

In a write method of a sixth developed form, newly supplied address and data may be stored in the write address register and the data register, respectively, while (i.e., in parallel with that) the second write cycle is being executed.

In a write method of a seventh developed form, when a read request occurs in a write method of a semiconductor memory device, a read control may be performed by comparing an address held in the write address register and an address corresponding to the read request.

In a write method of an eighth developed form, data held in the data register may be read when an address held in the write address register and an address corresponding to the read request coincide.

A semiconductor memory device relating to another aspect of the present invention comprises a memory cell array that comprises a memory cell including a programmable resistance element at an intersection of a bit line and a word line; an address register that temporarily holds an address supplied externally; a write address register that receives and holds an address held in the address register upon a write request; and a data register that holds write data accompanying the write request. Data held in the data register is written to a memory cell selected from the memory cell array according to an address held in the write address register corresponding to a next write request following the write request.

A semiconductor memory device of a first developed form may further comprise: a read comparator that compares an address held in the address register and an address held in the write address register; a multiplexer circuit that selects between an output of the memory cell and an output of the data register based on a coincidence result outputted by the read comparator. An output of the data register may become an output data that corresponds to a read request when an address held in the address register upon the read request and an address held in the write address register coincide.

A semiconductor memory device of a second developed form may further comprise write control means (or module) for executing a first write cycle where the resistance element is changed from a first state to a second state and a second write cycle where the phase-change element is changed from the second state to the first state.

In a semiconductor memory device of a third developed form, the write control means (or module) may execute the first write cycle upon a first write request, detect a second write request following the first write request, and execute the second write cycle.

In a semiconductor memory device of a fourth developed form, newly supplied address and data may be stored in the write address register and the data register, respectively, while the second write cycle is being executed.

In a semiconductor memory device of a fifth developed form, a resistance value of the resistance element in the first state may be higher than a resistance value of the resistance element in the second state.

In a semiconductor memory device of a sixth developed form, a resistance value of the resistance element in the first state may be lower than a resistance value of the resistance element in the second state.

In a semiconductor memory device of a seventh developed form, the resistance element may include a material that undergoes phase-change between first and second states.

In a semiconductor memory device of an eighth developed form, the resistance element may be programmed so that it is in a crystalline state when the phase-change material is in the first state and is in an amorphous state when the phase-change material is in the second state.

In a semiconductor memory device of a ninth developed form, the resistance element may be programmed so that it is in an amorphous state when the phase-change material is in the first state and is in a crystalline state when the phase-change material is in the second state.

The meritorious effects of the present invention are summarized as follows.

According to the present invention, the essential write time can be made shorter by applying the late write method, the stress caused by access to a memory cell is reduced, and a semiconductor memory device having high compatibility with synchronous DRAM interface can be formulated.

PREFERRED EMBODIMENTS OF THE INVENTION

A semiconductor memory device relating to an embodiment of the present invention comprises a memory cell, including a phase-change element provided in the intersection of a bit line and word line, in a memory cell array. It temporarily holds a write address and data accompanying a write request in a write address register and a data register respectively, and does not write to the memory cell array in this cycle of write request. And when a next write request occurs, the held data is written to the memory cell array. At this time, two write cycles—RESET cycle and SET cycle— are provided. Then after the written (i.e., stored) contents of the memory cell and the write data (data to be newly written) are compared and only SET cell is temporarily reset (amorphization turning to the high-resistance state), only SET data is written (crystallization, turning to the low-resistance state). By employing such a write method, a semiconductor memory device highly compatible with synchronous DRAM can be formulated while decreasing the essential write time of a phase-change memory, which requires a longer write time compared with DRAM.

Further, such a semiconductor memory device can prevent the same data from being written to the same memory cell excessively (or repeatedly). In other words, even when local access is consecutively in series made, e.g. when the same address data is read/written repeatedly, the access is made to the data register without directly reading from or writing to the memory cell, reducing the excessive (redundant) stress and improving the retention characteristics. Hereinafter, the embodiments of the present invention will be described in detail with reference to the drawings.

Figure 1:
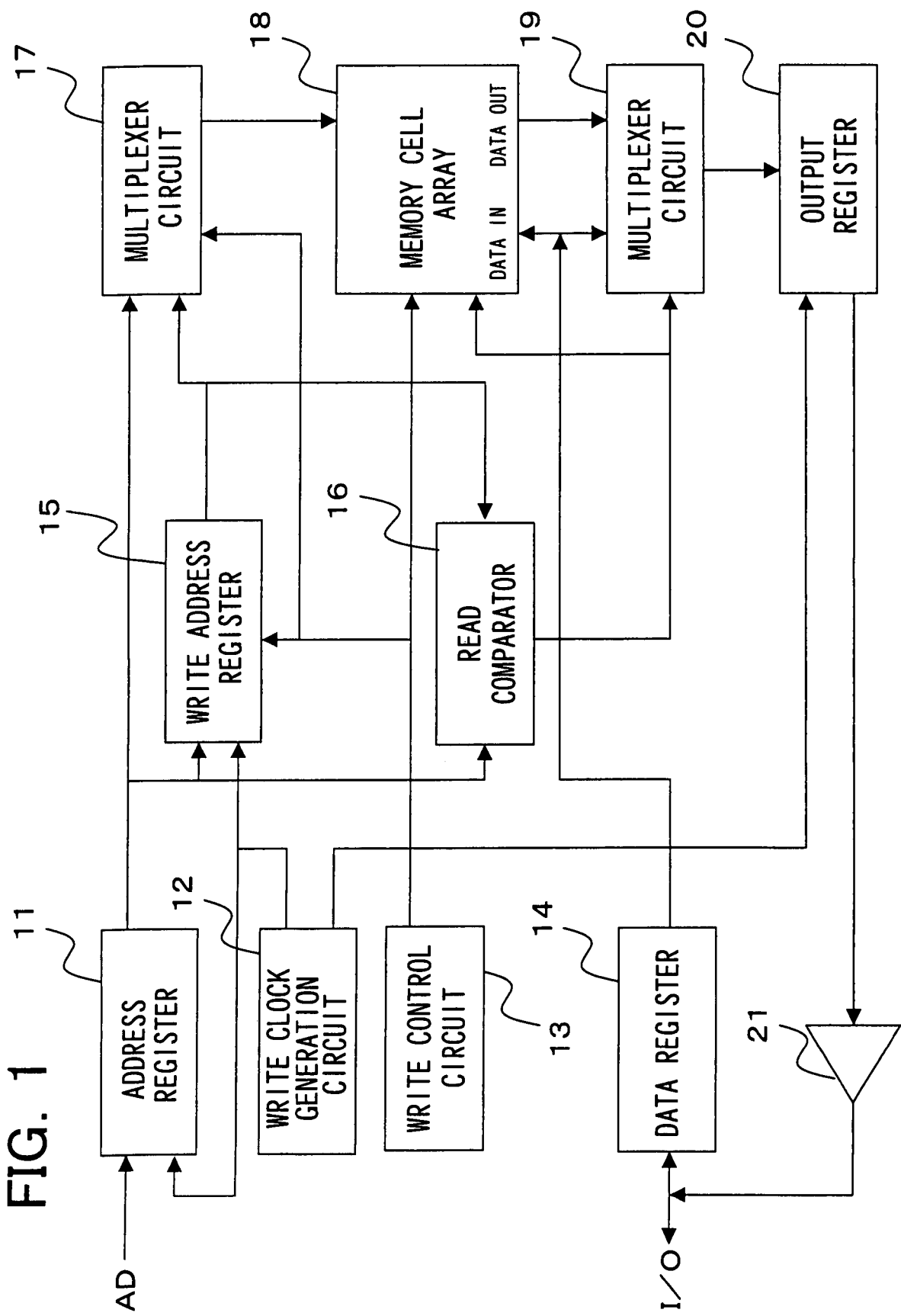
FIG. 1 is a block diagram illustrating the formulation of a semiconductor memory device relating to a first embodiment of the present invention.

FIG. 1 is a block diagram illustrating the formulation of a semiconductor memory device relating to a first embodiment of the present invention. In FIG. 1, the semiconductor memory device comprises an address register 11, a write clock generation circuit 12, a write control circuit 13, a data register 14, a write address register 15, a read comparator 16, multiplexer circuits (MUX) 17 and 19, a memory cell array 18, an output register 20, and a buffer 21. Further, the memory cell array 18 includes a memory cell that includes a phase-change element provided at the intersection of a bit line and word line, both of which are not shown in the drawing.

The address register 11 receives an address of a memory cell that is the object of a write operation from an external address terminal AD and holds it, and then outputs it to the write address register 15. The write address register 15 temporarily stores the write address. The write clock generation circuit 12 controls the operation timings of the write address register 15 and the address register 11. The multiplexer circuit 17 is controlled by the write control circuit 13, and it multiplexes (selects) the address information outputted by the write address register 15 and the address register 11, and outputs the write address to the memory cell array 18.

The input data supplied by an external terminal I/O and written to the memory cell that is the object of the write operation is temporarily held by the data register 14, and outputted to an input "Data In" of the memory cell array 18 and the multiplexer circuit 19. The memory cell array 18 is controlled by the write control circuit 13, and it writes the data outputted by the data register 14 to the memory cell that is the object of the write operation, based on the address outputted by the multiplexer circuit 17.

The read comparator 16 receives the outputs of the address register 11 and the write address register 15 and generates a comparison signal. The multiplexer circuit 19 receives the comparison signal outputted by the read comparator 16, switches an output "Data Out" of the memory cell array 18 and the output of the data register 14, and outputs the result to the output register 20. The output register 20 is controlled by the write clock generation circuit 12, and it receives the output of the multiplexer circuit 19 and outputs it to the external terminal I/O via the buffer 21.

Next, the late write operation will be explained. When the address and data of the memory cell that is the object of the operation are received according to a write request, the address data that has been temporarily held in the address register 11 is stored in the write address register 15 by the write clock generation circuit 12. Further, the write data is supplied from the external terminal I/O, temporarily held in the data register 14, and supplied to the "Data In" of the memory cell array and the multiplexer circuit 19. At this point, the data is not written to the memory cell array 18. When a new address is supplied by a next write request, the write data in the data register 14 is written to the memory cell array 18 based on the address data in the write address register 15, which has been held. At the same time, the new address and data are stored in the write address register 15 and the data register 14, respectively, and the data is not written to the memory cell array 18 that corresponds to this new address at this point.

When a read request subsequently occurs, the read comparator 16 determines whether or not the value of the address held in the address register 11 coincide with that of the write address register 15. If they do <Yes>, the data will be sent by the data register 14 to the output register 20 via the multiplexer circuit 19 and outputted externally (called "hit read"). If they are different addresses, access is made to a memory cell in the memory cell array 18 according to the value of the address register 11, and a read operation is performed from "Data Out."

As described above, in the late write operation, a write address and data accompanying a write request are temporarily held and the data is not written to the memory cell array 18 in this cycle of write request. And the held data is written to the memory cell array 18 when a next write request occurs.

Figure 2:
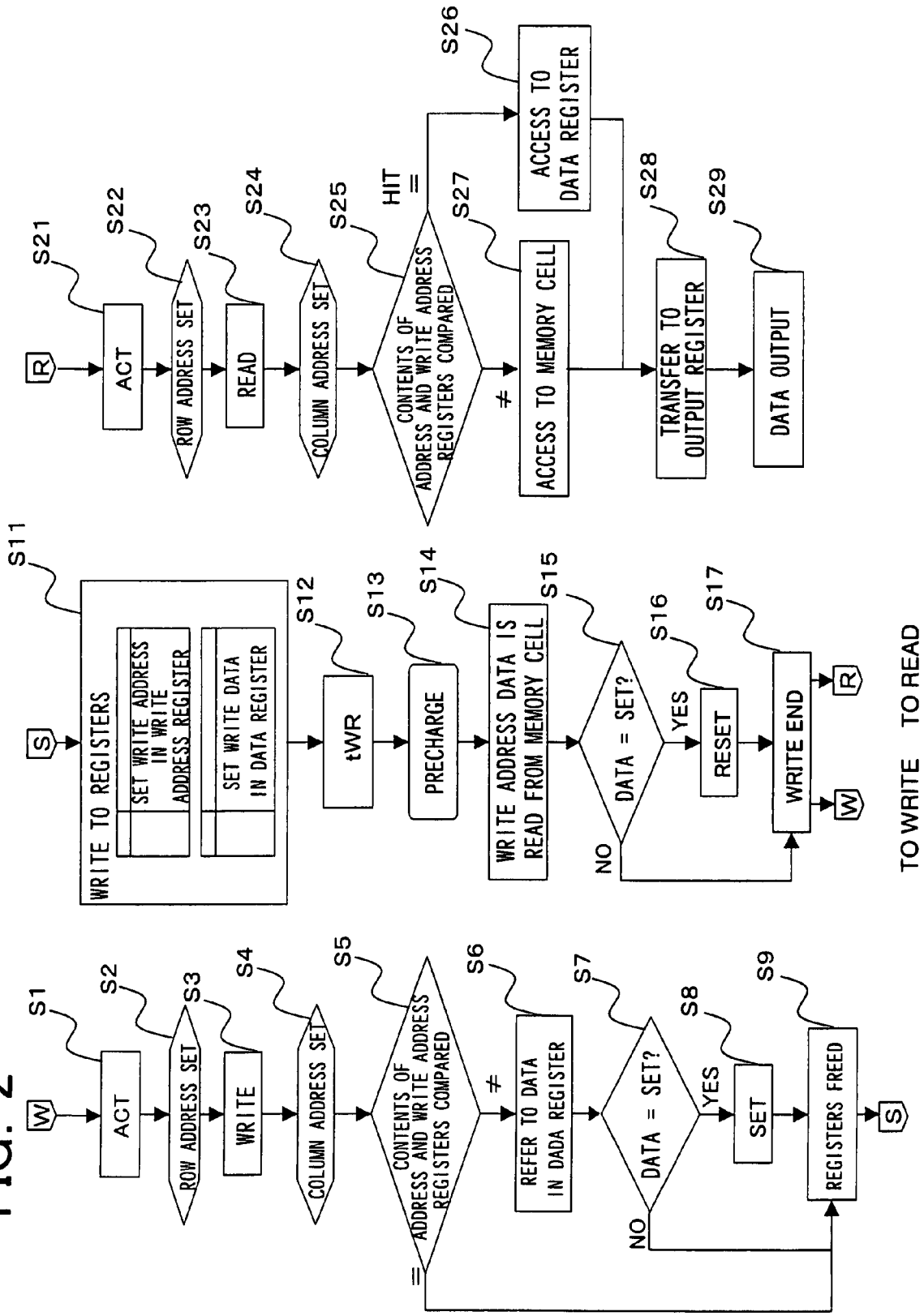
FIG. 2 is a flowchart of the read/write operations relating to the first embodiment of the present invention.

Next, the read/write operations are described in detail. FIG. 2 is a flowchart of the read/write operations relating to the first embodiment of the present invention.

First, the write operation will be explained. In step S1, the semiconductor memory device receives an ACT command. And the semiconductor memory device is set to an operation mode by a control circuit not shown in the drawing.

In step S2, a row address of the memory cell array is set.

In step S3, a write command (WRITE) is inputted.

In step S4, a column address of the memory cell array is set. The row address and the column address are held in the address register.

In step S5, the contents of the address register and the write address register are compared. If they coincide, the operation proceeds to step S9, and if they do not, it proceeds to step S6.

In the step S6, the data in the data register is referred to.

In step S7, whether or not the referred data is "SET" (crystallization, lowering the resistance) is determined. If it is "SET," the operation proceeds to step S8, and if it is not "SET," the operation proceeds to step S9 wherein registers are forced.

In the step S8, the "SET" is written to the memory cell specified by the row address and the column address.

In the step S9, the data register and the address register are freed, and the operation proceeds to step S11.

In the step S11, the write address is set in the write address register, and the write data is set in the data register.

In step S12, the operation waits for the time tWR.

In step S13, precharge is performed.

In step S14, the data corresponding to the write address is read from the memory cell.

In step S15, whether or not the read data is "SET" is determined. If it is SET, the operation proceeds to step S16, and if it is not, the operation proceeds to a step S17.

In the step S16, "RESET" (amorphization, turning to the high-resistance state) is written to the corresponding memory cell.

In the step S17, the write operation is completed. When another write operation is performed after this, the operation proceeds to the step S1 and when a read operation is performed, it proceeds to step S21.

Next, the read operation will be explained. In the step S21, an ACT command is inputted.

In step S22, a row address of the memory cell array is set.

In step S23, a read command is inputted.

In step S24, a column address of the memory cell array is set. The row address and the column address are held in the address register.

In step S25, the contents of the address register and the contents of the write address register are compared. If both of them coincide (Hit), the operation proceeds to step S26, and if they do not, it proceeds to step S27.

In the step S26, access is made to the data register and data is read. The operation proceeds to step S28.

In the step S27, access is made to the memory cell and data is read.

In the step S28, the read data is transferred to the output register.

In step S29, the data is outputted.

Figure 3:
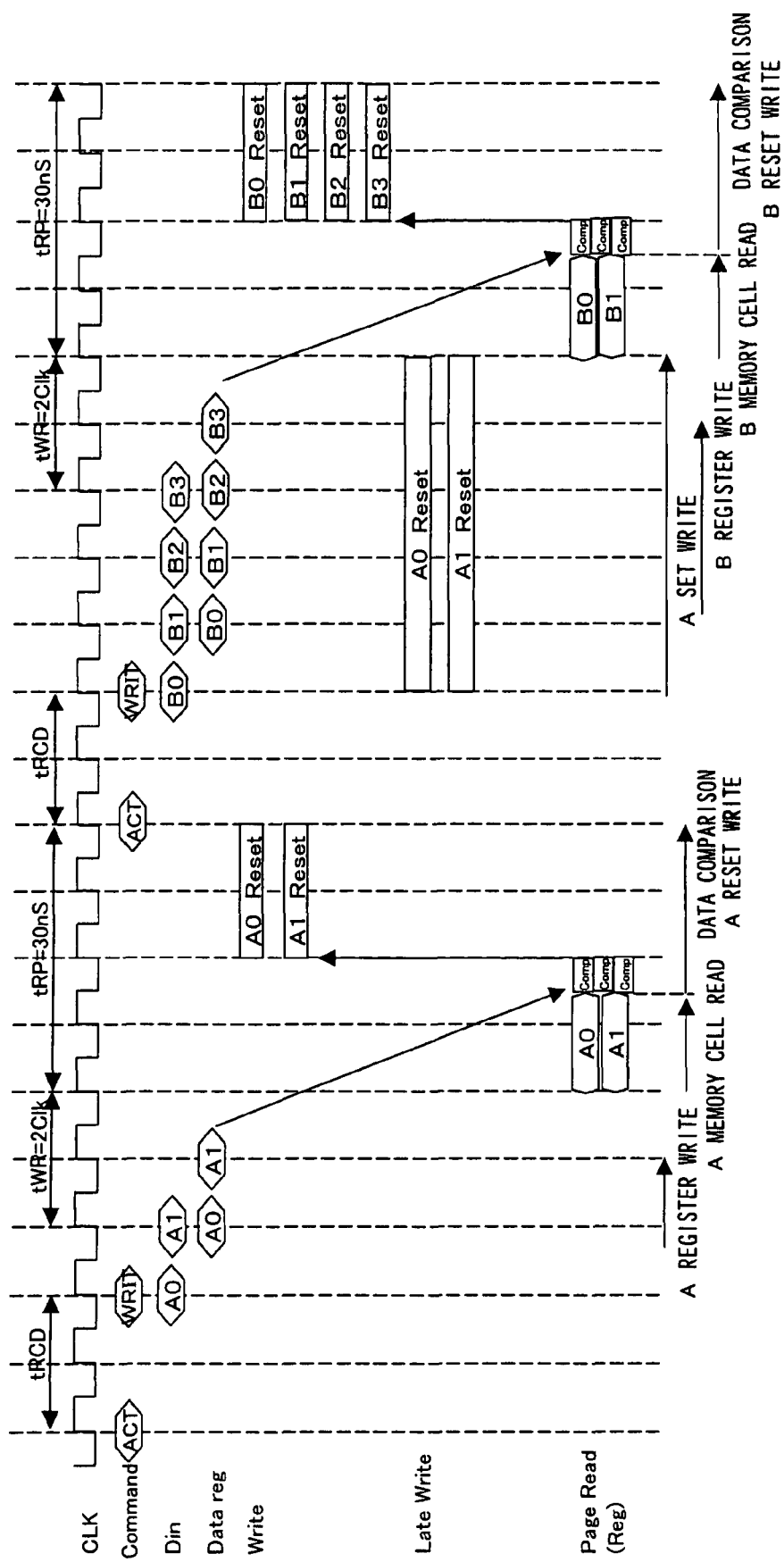
FIG. 3 is a timing chart of the write operation of the semiconductor memory device relating to the first embodiment of the present invention.

Next, the write timing of a semiconductor memory device that operates as described above will be explained. FIG. 3 is a timing chart of the write operation of the semiconductor memory device relating to the first embodiment of the present invention. For the sake of explanation, we will assume that the semiconductor memory device is a SDRAM with the following specifications: 1CLK=10 ns, tRDC =20 ns, tWR=2CLK, tRP=30 ns, and a minimum burst length of BL=4. Further, the RESET time of the phase-change element (turning to the high-resistance stance, amorphization) is 20 ns, and the SET time (turning to the low-resistance state, crystallization) is 50 ns.

Figure 8:
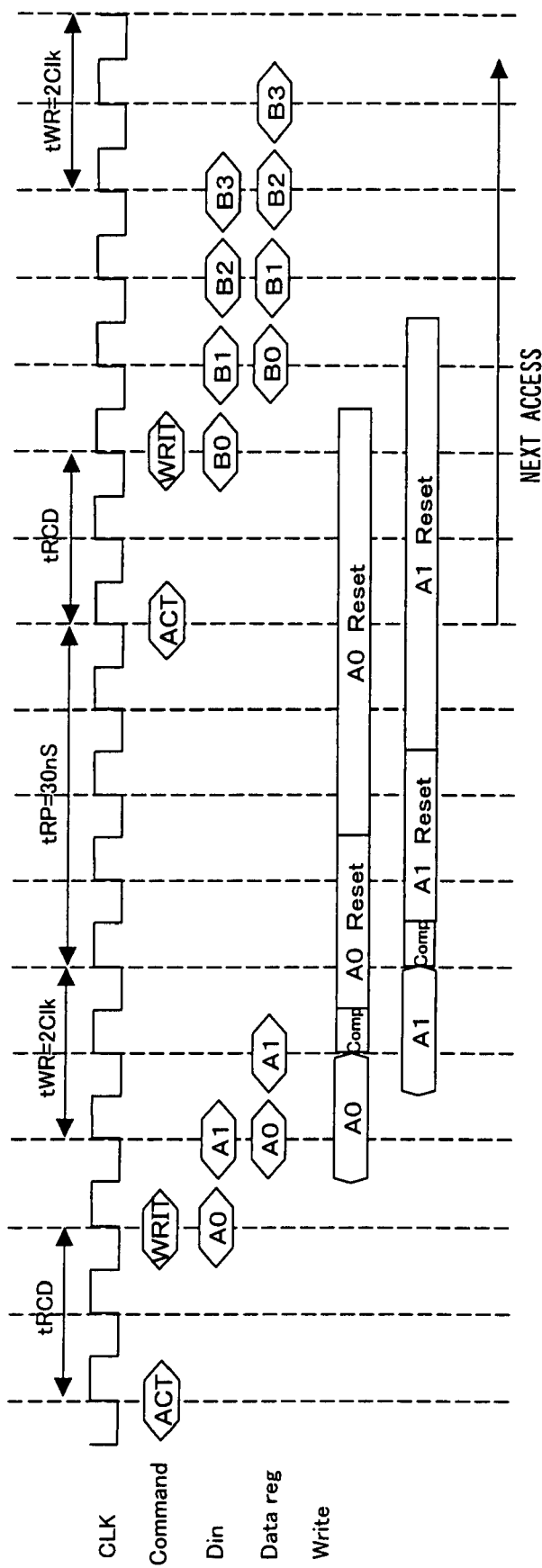
FIG. 8 is a timing chart, analyzed by the present inventors, of the write operation of a conventional semiconductor memory device.

First, a case of the conventional SDRAM as shown in FIG. 8 will be discussed. When a real-time write operation is performed after a write request occurs, (read time+time for comparing with the write data)+RESET time+SET time is 2CL(20 ns)+20 ns+50 ns=90 ns. Meanwhile, the time required from the last address input to the completion of the write operation is tWR+tRP=2CL(20 ns)+30 ns=50 ns, and this obviously does not satisfy the specifications.

On the other hand, according to the present invention, a write address A is set, at the same time as a write command WRIT, after a time tRCD has passed since an active command ACT is inputted as shown in FIG. 3. Here, the values of the address and the write address register are compared. When they coincide, the registers (14, 15) are freed, and then address and data are respectively set in the write address register and the data register such as A0 and A1. The data of the write request is temporarily read ("A memory cell read" in FIG. 3) after the time tWR but not later than a time tRP=30 ns since the last address and data input is completed. When the read data is SET (data 1), a RESET write operation (data 0) is only performed on this cell ("data comparison, A RESET write" in FIG. 3). In other words, writing the same data to the memory cell for which a write request is made is prevented, and the cell is temporarily set to a RESET state at the same time.

Note that a method in which the cell is set to a SET state might appear possible, however, taking tRP into consideration, the standard will be not met with the assumed specifications. Further, since this method will not have the compatibility with general SDRAM interface, it is not employed. If the standard allows it, the cell can be set to a SET state.

Here, the memory cell for which the write request is made is now in the RESET state, and the address and the data for which the write request is made are held in the write address register and the data register, respectively. Here, when a read request occurs, the supplied address and the value of the address register are compared. When they coincide, access is made to the data register, the data is transferred to the output register, and it is outputted (Hit read). On the other hand, when they are different, access is made to a memory cell according to the supplied address, and after the data is transferred to the output register, the data is outputted.

When a next write request occurs, a new address B and the values of the write address register are compared. Since this address is different from the previous one, a write operation to the corresponding memory cell is prepared, referring to the value of the write address register. Next, referring to the value of the data register, a SET write operation is performed on only cells with data 1 (SET) ("A SET write" in FIG. 3), and at the same time, the address and data registers are freed, and a new address and data B0, B1, B2 . . . are stored in the address and data registers in order ("B register write" in FIG. 3).

After the last address and data B3 are inputted and the write recovery time tWR has passed, a memory cell corresponding to the current input address B is selected as soon as the above-mentioned A SET write operation is completed, and the data of the write request address is temporarily read ("B memory cell read" in FIG. 3). When the read data is SET (data 1), a RESET write operation is performed on only this cell (data 0). The data is held in the data register until the next write request, and according to the write request, a SET write operation is performed on only cells with data 1 (SET). Here, since the SET write operation takes 50 ns and the time from the occurrence of the write request to the tWR is 50 ns when BL=4, the write operation does not add any extra time.

Further, even when write/read requests to the same address repeatedly occurs, no write operation is performed on the memory cell. Instead, the register is rewritten and read, reducing the stress on the memory cell greatly.

As described above excessive, writing the same data to the same memory cell can be prevented by applying the late write method in a write method to overcome the limitation of the phase-change element, storing the write address and the data in the write address register and the data register, providing two write cycles, RESET cycle and SET cycle, comparing the write content of the memory cell and the write (or rewrite) data, and writing only SET (crystallization) data after temporarily resetting SET cells only (amorphization). In other words, even when local access such as write/read requests to the same address is repeatedly made, since access is made to the data register and read/write operations are not directly performed on the memory cell, the stress on the memory cell is reduced.

Figure 4:
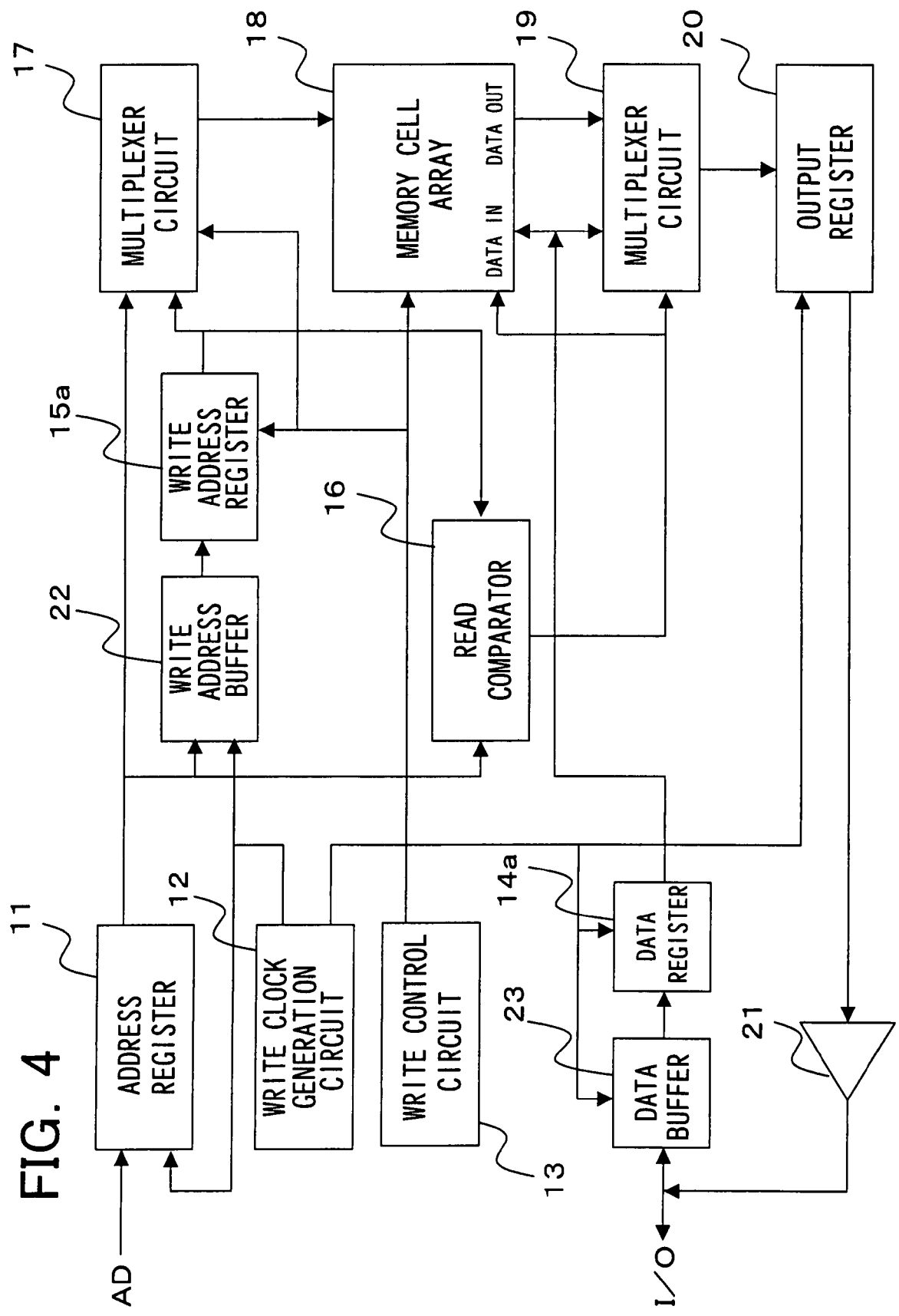
FIG. 4 is a block diagram illustrating the formulation of a semiconductor memory device relating to a second embodiment of the present invention.

FIG. 4 is a block diagram illustrating the structure of a semiconductor memory device relating to a second embodiment of the present invention. Comparing FIG. 4 with FIG. 1, the differences reside in that a write address buffer 22 is provided between a write address register 15a and the address register 11, a data buffer 23 is provided between a data register 14a and the I/O, and they are controlled by the write clock generation circuit 12. Other than that, the same symbols in FIG. 1 indicates the same things in FIG. 4, and the explanation of these are omitted.

Figure 5:
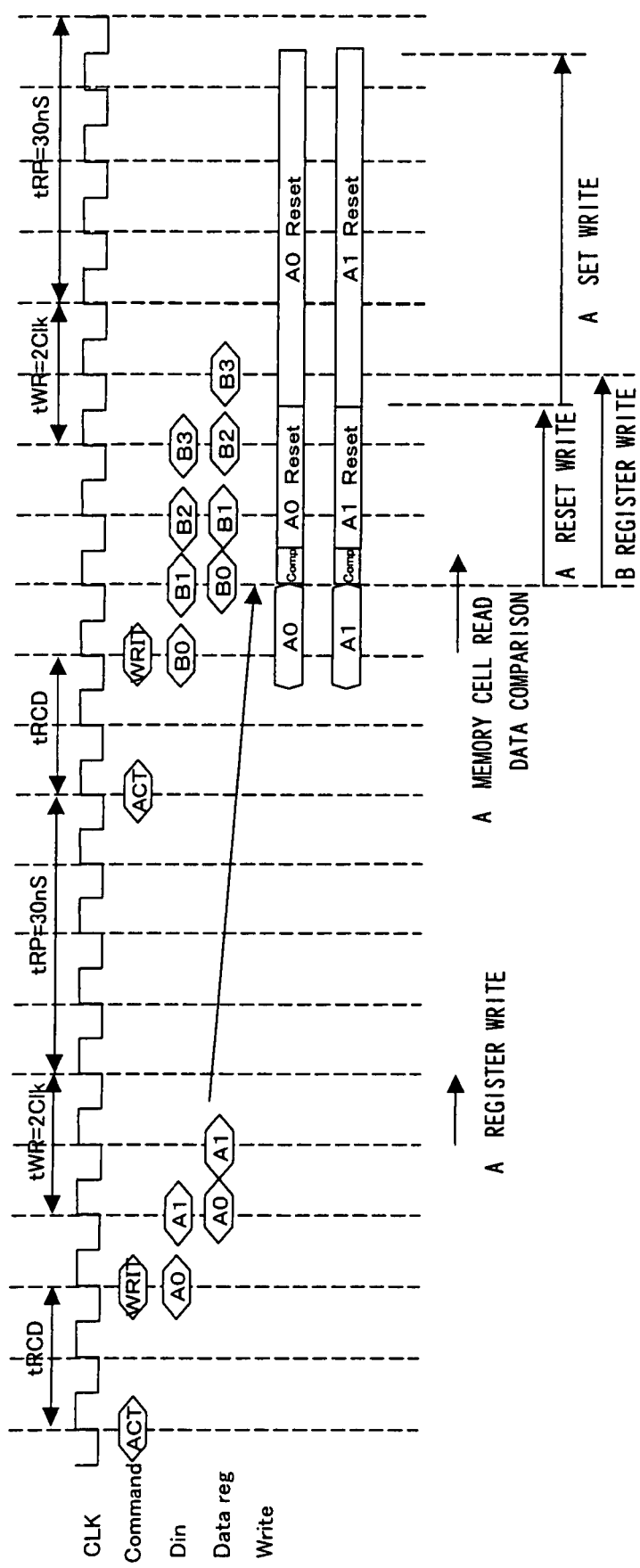
FIG. 5 is a timing chart of the write operation of the semiconductor memory device relating to the second embodiment of the present invention.
Figure 6:
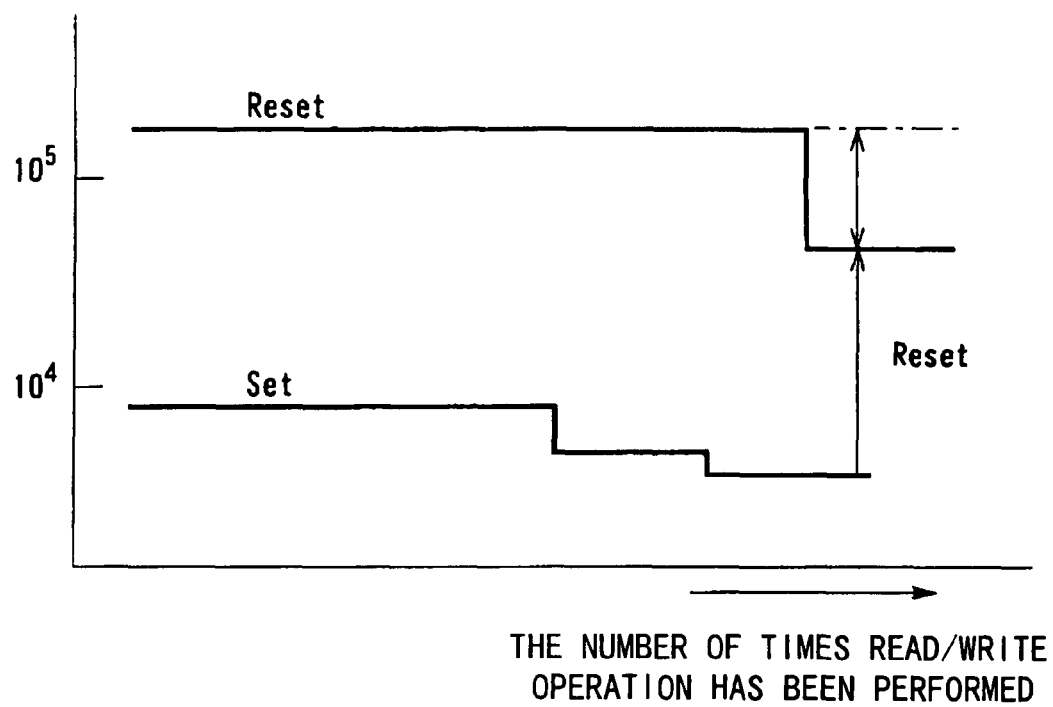
FIG. 6 is a drawing, analyzed by the present inventors, showing the resistance value change of a conventional phase-change element caused by read/write operations.
Figure 7:
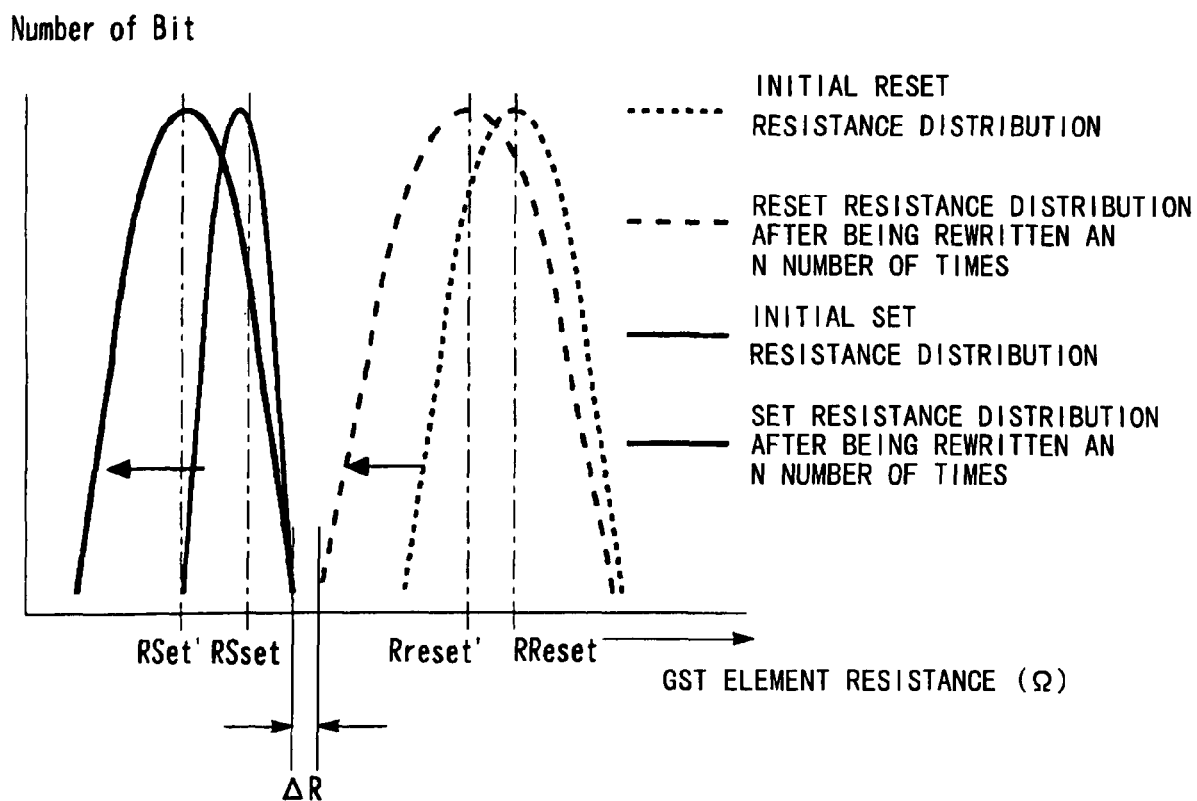
FIG. 7 is a drawing, analyzed by the present inventors, illustrating changes and distributions of the resistance value of the conventional phase-change element after being read/written.

FIG. 5 is a timing chart of the write operation of the semiconductor memory device relating to the second embodiment of the present invention. Referring to FIGS. 4 and 5, the operation of the semiconductor memory device relating to the second embodiment of the present invention will be described. First, a write request command WRIT is inputted following an ACT command. According to a write request address A accompanying this, an address and data A0, A1 . . . are stored in the write address buffer 22 and the data buffer 23. After the last address is completed and at the conclusion of the write recovery time tWR, the data in the write address buffer 22 is transferred to the write address register 15a and held. The data in the data buffer 23 is transferred to and held in the data register 14a.

When a next write operation occurs (next ACT and write commands) and new address and data requests occur, the memory cell array 18 is read according to the write address register 15a and the data register 14a ("A memory cell read/data comparison" in FIG. 5), and the data stored in the data register 14a and the read data are compared. When the read data is SET (data 1), a RESET write operation (data 0) is performed on only these cells ("A RESET write" in FIG. 5), and then a SET write operation is performed on only the memory cells corresponding to the address of data 1 ("A SET write" in FIG. 5).

Meanwhile, the new address B and the data B0, B1 . . . are temporarily stored in the write address buffer 22 and the data buffer 23 respectively, which have been freed. At the conclusion of the tWR, the data are transferred to the write address register 15a and the data register 14a, and are held until the next write request. The operation in the case when a read request occurs is the same as that of the first embodiment, therefore, the explanation of it will be omitted.

Further, when the semiconductor memory device goes into a standby mode or the power is turned off, the contents of the registers are temporarily written, and the power is cut off after the write is completed.

In the semiconductor memory device relating to the second embodiment, it is easy to control access to the memory cell, as compared with the first embodiment, since a write sequence in a write operation of a next instruction is performed en bloc.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor memory device comprising:
   a plurality of memory cells, each of which comprises a programmable resistance element that stores one of binary data as a first resistance state and the other of binary data as a second resistance state; and
   a data write control circuit performing on a memory cell designated by address information, a data write operation having first and second cycles, the data write operation being selected, in response to data currently stored into and data to be newly written into the memory cell, from a first combination of a first operation and a second operations which are carried out respectively in the first and second cycles, a second combination of the first operation and a third operation which are carried out respectively in the first and second cycles, a third combination of the third operation and the second operation which are carried out respectively in the first and second cycles and a fourth combination of the third operation which is carried out in each of the first and second cycles, the first operation being to supply the memory cell with a first set of signal voltages to cause the first resistance state, the second operation being to supply the memory cell with a second set of signal voltages to cause the second resistance state, and the third operation being to supply the memory cell with no signal voltages to cause no change in resistance state of the memory element.

2. The device as defined in claim 1, wherein the first resistance state is lower than the second resistance state.

3. The device as defined in claim 1, wherein the programmable resistance element comprises a material that is subject to phase-changes between said first and second resistance states.

4. The device as defined in claim 1, wherein said programmable resistance element comprises a material that provides the first resistance state in a crystalline and the second resistance state in an amorphous state.

5. The device as defined in claim 1, wherein the first cycle is followed by the second cycle.

6. A method of writing data into a memory cell that is programmable between first and second states in phase, the first state in phase providing one of binary data and the second state in phase providing the other of binary data, the method comprising:
   outputting data to be written into the memory cell;
   changing the memory cell from the first state to the second state when the memory cell is currently providing the first state to store the one of binary data and the data to be written represents the one of the binary data, the memory cell being thereby caused to store the other of binary data; and changing back the memory cell from the second state to the first state to cause the memory cell to store again the one of the binary data.

7. The method as defined in claim 6, wherein the memory cell comprises a material that is changeable between a crystalline state and an amorphous state, the crystalline state represents the first state and the amorphous state represents the second state.

8. The method as defined in claim 7, further comprising;

outputting second data to be written into the memory cell; and supplying the memory cell with no signal voltages when the memory cell is currently providing the second state to store the other of binary data and the second data to be written represents the other of the binary data, the memory cell being thereby caused to continue store the other of binary data.

9. A semiconductor memory device comprising:

a memory cell array comprises a plurality of memory cells each including a programmable resistance element that stores one of binary data as a first resistance state and the other of binary data as a second resistance state;

an address register that temporarily holds address information;

a data register that responds to receipt of a write request to temporarily hold write data that is to be written into a memory cell designated by the address information; and a data write control circuit performing a data write operation of the write data into the memory cell upon receipt of a next write request following the receipt of the write request, the data write operation having first and second cycles and being controlled by data currently stored into the memory cell and the write data to be written into the memory cell.

10. A semiconductor memory device as defined in claim 9, wherein the data write operation is selected from a first combination of a first operation and a second operation which are carried out respectively in the first and second cycles, a second combination of the first operation and a third operation which are carried out respectively in the first and second cycles, a third combination of the third operation and the second operation which are carried out respectively in the first and second cycles and a fourth combination of the third operation which is carried out in each of the first and second cycles, the first operation being to supply the memory cell with a first set of signal voltages to cause the first resistance state, the second operation being to supply the memory cell with a second set of signal voltages to cause the second resistance state, and the third operation being to supply the memory cell with no signal voltages to cause no change in resistance state of the memory element.

* * * * *